US011327514B2

(12) United States Patent
Branca

(10) Patent No.: US 11,327,514 B2
(45) Date of Patent: May 10, 2022

(54) DEVICE FOR PROVIDING A CURRENT

(71) Applicant: STMicroelectronics (Grenoble 2) SAS, Grenoble (FR)

(72) Inventor: Xavier Branca, Sassenage (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 17/208,926

(22) Filed: Mar. 22, 2021

(65) Prior Publication Data

US 2021/0303011 A1 Sep. 30, 2021

(30) Foreign Application Priority Data

Mar. 26, 2020 (FR) ...................................... 2002971

(51) Int. Cl.
*G05F 1/46* (2006.01)
*H05B 45/37* (2020.01)
*G05F 1/26* (2006.01)

(52) U.S. Cl.
CPC ............... *G05F 1/461* (2013.01); *G05F 1/26* (2013.01); *H05B 45/37* (2020.01)

(58) Field of Classification Search
CPC combination set(s) only.
See application file for complete search history.

(56) References Cited

U.S. PATENT DOCUMENTS

| 7,362,079 B1 * | 4/2008 | Maheedhar | G05F 1/56 323/269 |
| 9,898,030 B2 * | 2/2018 | Lahiri | G05F 3/30 |
| 10,003,174 B1 | 6/2018 | Branca | |
| 10,868,522 B2 | 12/2020 | Branca | |
| 11,036,248 B1 * | 6/2021 | Podzemny | G05F 1/565 |
| 2006/0255838 A1 | 11/2006 | Bergmann | |
| 2010/0109435 A1 | 5/2010 | Ahmadi et al. | |
| 2012/0119653 A1 | 5/2012 | Bianco et al. | |
| 2012/0139443 A1 | 6/2012 | Chu | |
| 2015/0223305 A1 | 8/2015 | Yang et al. | |
| 2017/0353156 A1 * | 12/2017 | Shimizu | H02M 3/07 |

FOREIGN PATENT DOCUMENTS

| EP | 1713053 A3 | 4/2009 |
| EP | 2642823 A1 | 9/2013 |
| JP | 2017139211 A | 8/2017 |

* cited by examiner

*Primary Examiner* — Long Nguyen
(74) *Attorney, Agent, or Firm* — Slater Matsil, LLP

(57) ABSTRACT

An embodiment device includes a first MOS transistor and a first resistor in series between first node and second nodes, the first resistor being connected to the second node; a second MOS transistor and a second resistor in series between the first and second nodes, the second resistor being connected to the second node and the gates of the first and second transistors being coupled to each other; an operational amplifier including a first terminal connected to a node of connection of the first resistor to the first transistor, a second terminal, and an output terminal coupled to the gate of the first transistor; and a circuit configured to supply a set point voltage to the second terminal of the amplifier.

22 Claims, 3 Drawing Sheets

DEVICE FOR PROVIDING A CURRENT

CROSS-REFERENCE TO RELATED APPLICATIONS

This application claims the benefit of French Application No. 2002971, filed on Mar. 26, 2020, which application is hereby incorporated herein by reference.

TECHNICAL FIELD

The present disclosure generally relates to electronic circuits and, more particularly, to current supply devices such as devices for supplying a laser source with a current.

BACKGROUND

Applications where a scene is illuminated with one or a plurality of laser beams, typically emitted in the form of periodic pulses, for example, at a frequency in the range from 10 to 300 MHz, are known.

Such applications are for example intended to determine a distance between a source of a laser beam and the scene, for example, to determine a three-dimensional mapping of the scene.

The more the scene to be illuminated is distant from the source(s) emitting the laser beams, typically light-emitting diodes, the higher the power of each emitted laser pulse should be.

It is thus desirable to be able to control the power of each laser pulse emitted by a laser source. This amounts in practice to controlling a current supplied to the laser source at each pulse. In other words, this amounts to supplying periodic current pulses to the laser source, each current pulse having the same value. Such a current value may be relatively high, that is, at least equal to one or a plurality of amperes.

FIG. 1 illustrates an example of a device 1 configured to supply current pulses to a laser diode 3. FIG. 1 is a copy of FIG. 1A of published US patent application 2017/0317665.

Device 1 comprises a current source 5 supplying a current I. Diode 3 is connected between ground GND and a switch 7 coupling diode 3 to current source 5. Switch 7 is controlled by a periodic square pulse signal $P_\alpha$ having a duty cycle $\alpha$, a period T, and being considered as varying between 0 and 1. At each period T of signal $P_\alpha$ for controlling switch 7, the current I flowing through diode 3 has a value $I_P$ for a time period $\alpha*T$ when switch 7 is on, and a zero value for a time period $(1-\alpha)*T$ when switch 7 is off. Current I thus has an average value equal to $\alpha*I_P$. By controlling source 5 so that it supplies an average value of current I equal to $\alpha*I_{P\text{-}TARGET}$, $I_{P\text{-}TARGET}$ being the targeted value for each current pulse, the current $I_P$ during a current pulse is then equal to $I_{P\text{-}TARGET}$.

More particularly, in FIG. 1, current source 5 comprises a DC/DC voltage converter 13. Converter 13 is controlled to supply a voltage V on the terminal of switch 7 connected to source 5, voltage V being regulated so that the current I supplied by converter 13, and thus by source 5, has an average value equal to $\alpha*I_{P\text{-}TARGET}$.

Although this is not shown in FIG. 1, in practice, DC/DC converter 13, typically a DC/DC converter of SMPS type ("Switched Mode Power Supply") comprises an inductance. The surface area occupied by this inductance increases the total surface area occupied by device 1. Further, the presence of such an inductance limits the maximum frequency of the current pulses that may be supplied to diode 3.

Device 1 is an example of a current supply device, and more particularly of a device for supplying a current in the form of periodic pulses to a laser source. There exist other known examples of such devices which will not be described herein.

SUMMARY

There is a need to overcome all or part of the disadvantages of known current supply devices.

In particular, there is a need to overcome all or part of the disadvantages of known devices for supplying a current in the form of periodic pulses to a laser source.

An embodiment overcomes all or part of the disadvantages of known current supply devices.

More particularly, an embodiment overcomes all or part of the disadvantages of known devices for supplying a current in the form of periodic pulses to a laser source.

An embodiment provides a current supply device comprising no DC/DC voltage converter comprising an inductance, to decrease the surface area occupied by the device with respect to that occupied by known current supply devices comprising such an inductance, for example, the device of FIG. 1.

Thus, an embodiment provides a device comprising a first MOS transistor and a first resistor in series between a first node and a second node, the first resistor being connected to the second node; a second MOS transistor and a second resistor in series between the first node and the second node, the second resistor being connected to the second node and a gate of the second transistor being coupled to a gate of the first transistor; an operational amplifier comprising a first terminal connected to a node of connection of the first resistor to the first transistor, a second terminal, and an output terminal coupled to the gate of the first transistor; and a first circuit configured to supply a set point voltage to the second terminal of the amplifier.

According to an embodiment, the first and second transistors are each configured to operate as a follower source.

According to an embodiment, the device further comprises a switch connected between a third node and a fourth node, the second node being configured to be connected to a first terminal of a laser source and the third node being configured to be connected to a second terminal of the laser source.

According to an embodiment, the laser source is a light-emitting diode.

According to an embodiment, the first terminal of the laser source is the anode of the light-emitting diode and the second terminal of the laser source is the cathode of the light-emitting diode.

According to an embodiment, the device further comprises a second circuit configured to supply a periodic control signal to the switch connected between the third and fourth nodes.

According to an embodiment, the first node is configured to receive a power supply potential, the fourth node being configured to receive a reference potential.

According to an embodiment, the device comprises a third circuit connected to the first and second nodes and being configured to adapt the power supply potential according to a voltage between the first and second nodes.

According to an embodiment, the device further comprises a charge pump for powering the operational amplifier.

According to an embodiment, the device further comprises a fourth circuit comprising a fifth circuit and a switch connected between the second node and the fifth circuit, the fifth circuit being configured to draw a current from the second node when the switch of the fourth circuit is on.

According to an embodiment, when a current flows through the second transistor, a value of the current is determined by the set point voltage, a value of the first resistor, a value of the second resistor, and dimensions of the first and second transistors.

According to an embodiment, the device comprises a current source configured to supply a set point current, the current source being connected between the first node and the second terminal of the amplifier, and a third resistor connected between the second terminal of the amplifier and the second node, the set point voltage being determined by a value of the set point current and the third resistance.

According to an embodiment, the device further comprises a switch connected between the gate of the first transistor and the gate of the second transistor and, preferably, another switch connected between the gate of the second transistor and the second node.

According to an embodiment, the device comprises a capacitor connected between the gate of the first transistor and the second node.

An embodiment provides an integrated circuit comprising the described device.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the various usual circuits or applications comprising a device for supplying a current to a laser source have not been detailed, the described embodiments and variants being compatible with such usual circuits and applications.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 2:
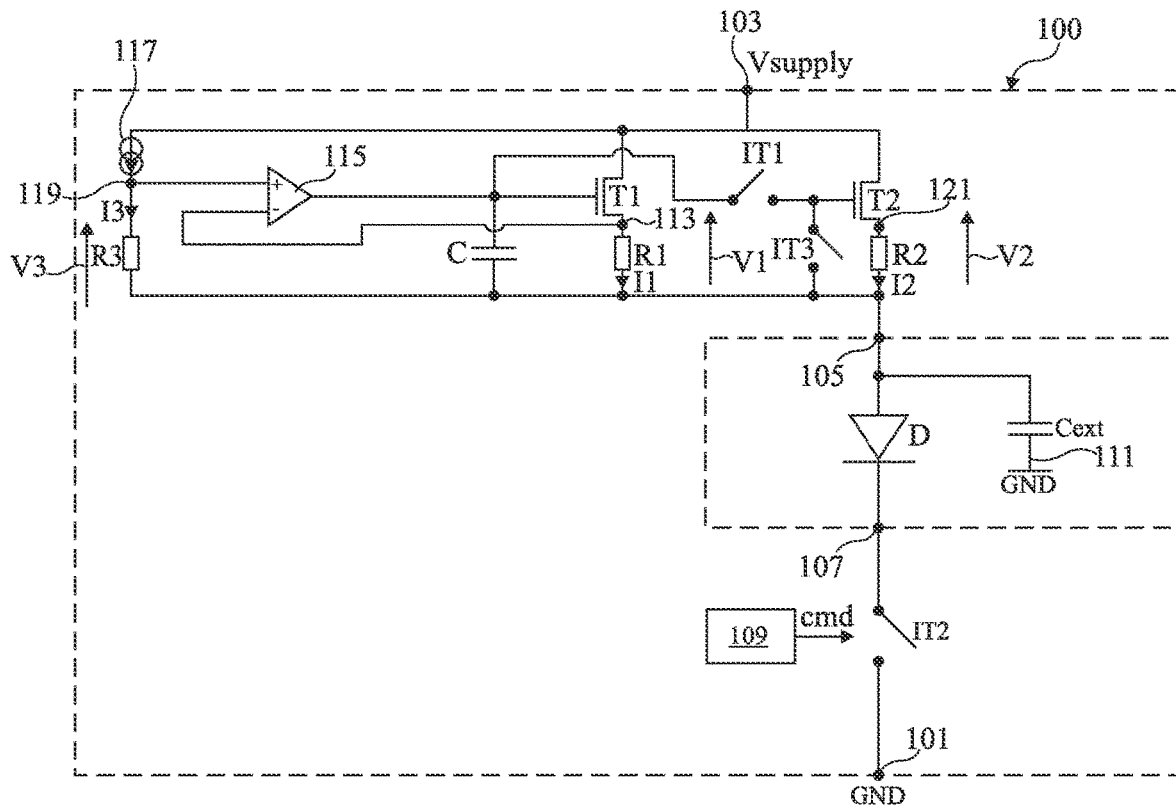
FIG. 2 shows, in the form of a circuit, an embodiment of a current supply device.

FIG. 2 shows, in the form of a circuit, an embodiment of a device 100 for supplying a current I2.

Device 100 is here configured to supply a laser diode D with current I2 in the form of current pulses, each current pulse I2 for example having a high value, for example, at least equal to one ampere, for example, equal to three amperes.

Device 100, delimited by dotted lines in FIG. 2, comprises a node 101 configured to receive a reference potential GND, typically the ground. Device 100 further comprises a node 103 configured to receive a supply potential Vsupply, for example, a positive potential. As an example, potential Vsupply is obtained from a battery of an electronic system, for example, an embarked system such as a camera, comprising device 100.

Device 100 comprises a node 105 configured to be connected to a first terminal of laser source D, that is, node 105 is intended to be connected to the first terminal of laser source D. Device 100 further comprises a node 107 configured to be connected to a second terminal of laser source D, that is, node 107 is intended to be connected to the second terminal of laser source D. In FIG. 2, device 100 is shown as being connected to laser source D.

Preferably, as shown in FIG. 2, laser source D is a light-emitting diode or DEL. Laser source D is for example configured to emit a laser beam in infrared, for example, a laser beam at a wavelength in the range from 750 nm to 3,000 nm.

In the example of FIG. 2, the first terminal of laser source D is the anode of diode D, the second terminal of laser source D being the cathode of diode D.

Device 100 comprises a switch IT2 connected between nodes 107 and 101. Device 100 further comprises a circuit 109 for controlling switch IT2. Circuit 109 is configured to supply a signal cmd for controlling switch IT2. Signal cmd is a periodic square pulse signal having its period determining the period of the laser pulses emitted by laser source D, and having its duty cycle determining the duration of the laser pulses emitted by laser source D. When signal cmd is at a first level, for example, a high level, switch IT2 is conductive, and when the signal is at a second level, for example, a low level, switch IT2 is off.

Although this is not detailed in FIG. 2, switch IT2 is for example implemented by means of one of a plurality of MOS "Metal Oxide Semiconductor") transistors.

For example, switch IT2 is implemented by means of two MOS transistors, for example, with an N channel, in series between nodes 107 and 101. One of the two transistors is connected to node 107 and is a high-voltage MOS transistor configured to withstand high voltages, for example, greater than 10 V, for example, in the order of 20 V, between the conduction terminals (source and drain). The other one of the two transistors is connected to node 101 and is a fast switching transistor configured to switch rapidly, for example, at frequencies at least equal to 10 MHz, preferably 100 MHz, or even 300 MHz. The gate of the high-voltage transistor receives a bias potential, for example, generated by a circuit, not shown, of device 100, the gate of the fast switching transistor receiving signal cmd.

Figure 1:
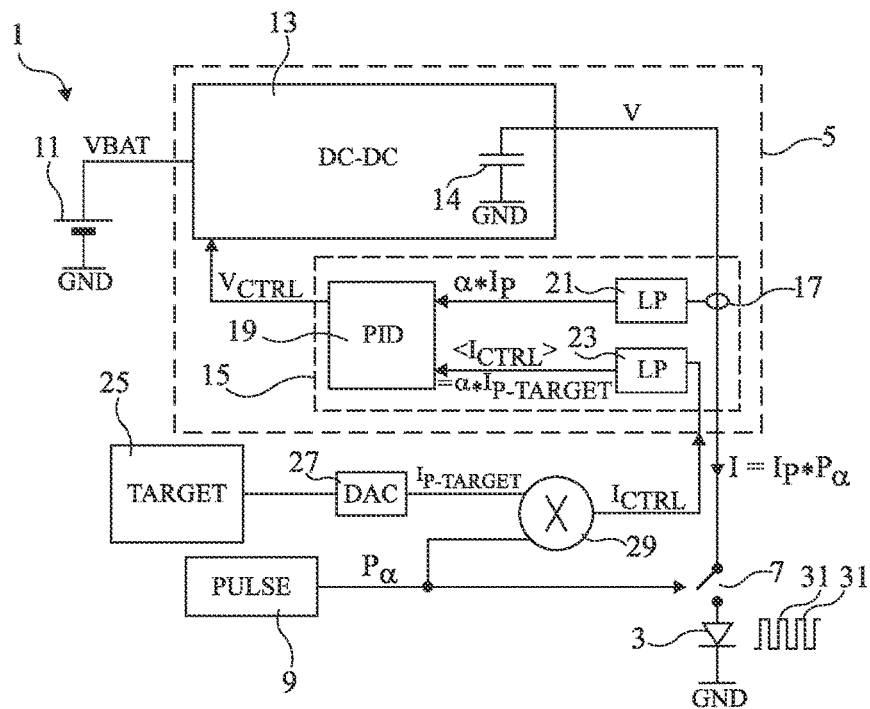
FIG. 1, previously described, shows an example of a known device for supplying current in the form of pulses to a laser diode.

Device 100 is configured so that, when switch IT2 is on and current I2 is supplied to node 105, current I2 flows from node 105 to node 107, via laser source D, which then emits a laser pulse. Similarly to what has been described in relation with FIG. 1, when a series of periodic laser pulses is emitted by laser source D, device 100 is configured to supply a current I2 having an average value $\beta*I2_P$, $\beta$ being the duty cycle of signal cmd, and $I2_P$ being the desired value of current I2 during a current pulse.

Device 100 comprises a MOS transistor T1 in series with a resistor R1, it being understood that resistor R1 may be implemented by means of one or a plurality of resistors. The source of transistor T1 and resistor R1 are connected to a same connection node 113.

In this example, transistor T1 has an N channel. Transistor T1, more exactly the drain of transistor T1, is then connected to node 103, resistor R3 being connected between nodes 105 and 113.

Device 100 comprises an operational amplifier 115. Although this is not shown in FIG. 2, amplifier 115 is preferably supplied with the potential difference between nodes 103 and 105, and then comprises a first power supply terminal coupled, for example, connected, to node 103 and a second power supply terminal connected to node 105, it being understood that, in the case where the potential difference between nodes 103 and 105 is sufficient to correctly power amplifier 115, device 100 comprises a charge pump or any other similar circuit to power the first power supply terminal of amplifier 115, from the potential of node 105, with a potential greater than that of node 103. For example, device 100 comprises a charge pump connected between nodes 103 and 105 or between nodes 105 and 101 or between nodes 101 and 103 or generally between two nodes of application of two potentials, the charge pump supplying a power supply potential to the first power supply terminal of amplifier 115 which is higher than the potential of node 103, amplifier 115 having its second power supply terminal connected to node 105.

Figure 4:
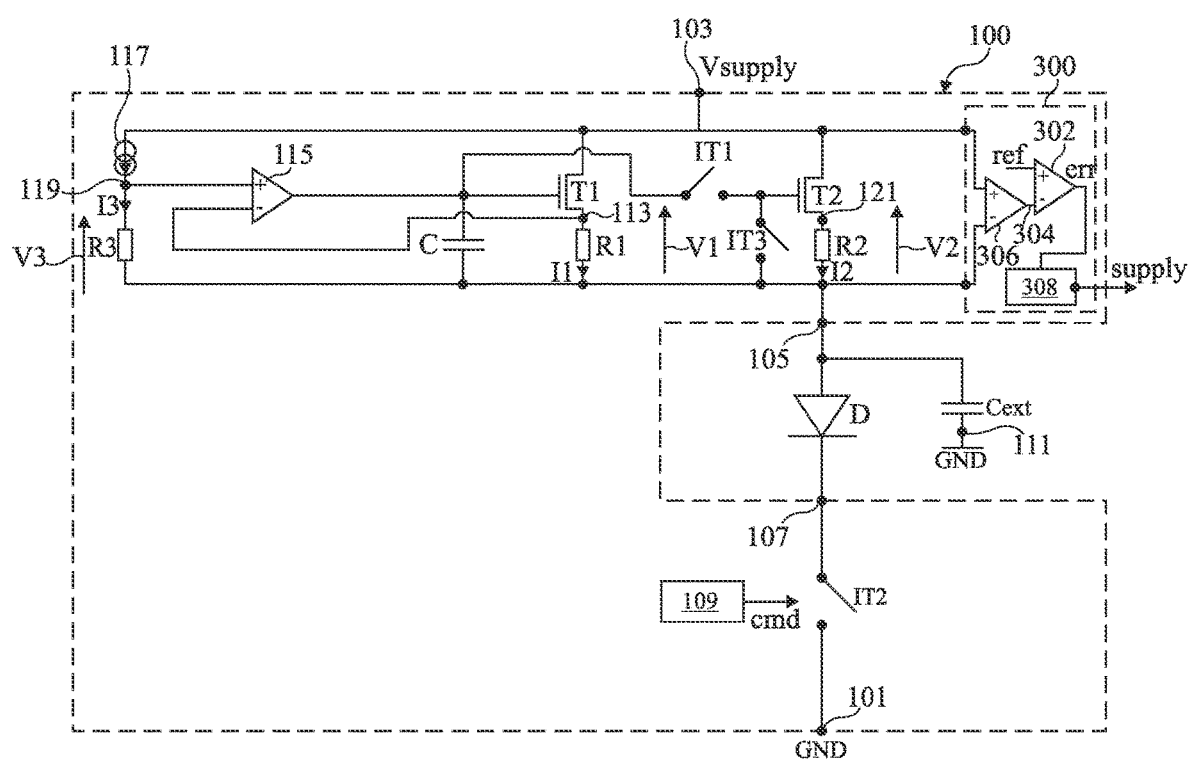
FIG. 4 shows, in the form of a circuit, another alternative embodiment of the device of FIG. 2.
Figure 5:
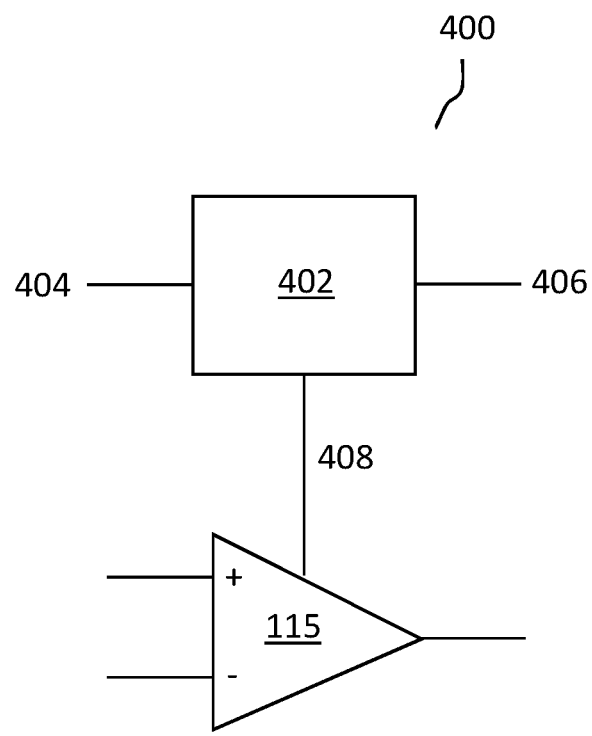
FIG. 5 shows, in the form of a circuit, a charge pump providing power to the operational amplifier.

FIG. 5 shows circuit 400 including charge pump 402 providing power 408 to a first power supply terminal of amplifier 115. Charge pump 402 is connected to first potential 404 and second potential 406. The first and second potentials may be nodes 103 and 105, nodes 105 and 101, nodes 101 and 103, or generally any two nodes of application of two potentials. Circuit 400 may be implemented in any of FIGS. 2-4.

Referring back to FIG. 2, first input terminal of amplifier 115 is connected to the source of transistor T1, that is, to node 113. A second input terminal of amplifier 115 is configured to receive a set point voltage V3, here equal to the potential difference between the second input of amplifier 115 and node 105 or, in other words, referenced to the potential of node 105. An output of amplifier 115 is coupled, for example, connected, as shown in FIG. 2, to the gate of transistor T1.

In this example where transistor T1 has an N channel, the first input terminal of amplifier 115 corresponds to its inverting input (−), and the second input terminal of amplifier 115 corresponds to its non-inverting input (+).

According to an embodiment, as illustrated in FIG. 2, device 100 comprises a current source 117 series-connected with a resistor R3 between nodes 103 and 105. Current source 117 and resistor R3 are connected to a same connection node 119, node 119 being connected to the second terminal of amplifier 115, that is, to the non-inverting input of amplifier 115 in the present example. Current source 117 is configured to supply a current I3 to resistor R3 or, in other words, to conduct current I3 in resistor R3, so that voltage V3 is determined by the voltage drop in resistor R3. In the example of FIG. 2, current source 117 is connected between nodes 103 and 119, resistor R3 being connected between nodes 119 and 105.

Preferably, source 117 is calibrated or adjusted prior to the use of device 100, to set voltage V3 to a desired value.

Preferably, source 117 delivers a low current I3 as compared with current I2. As an example, the value of current I3 is in the range from approximately 10 µA to approximately 100 µA, for example, from approximately 10 µA to approximately 50 µA, the value of current I3 being for example equal to approximately 15 µA.

In operation, transistor T1 is configured to operate as a follower source, and the output of amplifier 115 imposes a potential on the gate of transistor T1, so that a voltage V1 across resistor R1 is equal to voltage V3. Thus, a current I1 flowing through transistor T1 has a value set by the value of voltage V1 equal to voltage V3 and by the value of resistor R1. As an example, the value of current I1 is in the range from approximately 1 mA to approximately 10 mA, for example, from approximately 1 mA to approximately 5 mA, the value of current I1 for example being equal to approximately 1.5 mA.

When voltage V3 is supplied by the series association of source 117 and of resistor R3, the value of current I1 is set or determined by the value of current I3, the value of resistor R1, and the value of resistor R3. Preferably, current I3 is smaller than current I1 or, in other words, the value of resistor R1 is smaller than that of resistor R3. Preferably, current I3 is negligible as compared with current I1, current I3 for example being at least ten times smaller than current I1, or even at least one hundred times smaller than current I1 or, in other words, the value of resistor R1 is negligible as compared with that of resistor R3, the value of resistor R1 being for example at least ten times smaller than the value of resistor R3, or even at least one hundred times smaller than the value of resistor R3.

Device 100 comprises a MOS transistor T2 in series with a resistor R2, it being understood that resistor R2 may be implemented by means of one or a plurality of resistors. The source of transistor T2 and resistor R2 are connected to a same connection node 121. Further, the gate of transistor T2 is coupled to the gate of transistor T1. Transistor T2 is configured to operate as a follower source.

In this example, transistor T2 has an N channel like transistor T1. Transistor T2, more exactly the drain of transistor T2, is then connected to node 103, resistor R2 being connected between nodes 105 and 121.

According to the embodiment illustrated in FIG. 2, a switch IT1 is connected between the gate of transistor T1 and that of transistor T2.

Preferably, a switch IT3 is then connected between the gate of transistor T2 and node 105. Switch IT3 is controlled in phase opposition with respect to switch IT1. In other words, switch IT3 is off, respectively on, when switch IT1 is on, respectively off. Switch IT3 is configured to discharge the gate of transistor T2 when switch IT1 is off.

When switch IT1 is off, transistor T2 is off, which results in a zero current I2 whatever the off or on state of switch IT2. In other words, device 100 does not deliver current I2 to node 105.

However, when switch IT1 is on, the gate potential of transistor T2 is equal to the gate potential of transistor T1. As a result, a voltage V2 across resistor R2 is equal to the voltage V1 across resistor R1. Current I2 then flows through transistor T2 and laser source D if switch IT2 is on.

The provision of switch IT1 enables to alternate phases where laser source D emits periodic laser pulses, under control of switch IT2, and phases where laser source D emits no laser pulse, these last phases being typically longer than at least two periods of signal cmd.

When both switches IT1 and IT2 are on, the value of each current pulse I2 delivered to laser source D is set by the value of resistor R2 and by the value of current I1. In other words, the value of current I2 is set by the value of resistor R2, the value of resistor R1, and the value of voltage V3, the value of voltage V3 being set by the value of resistor R3 and of current I3 when voltage V3 is supplied by the series association of current source 117 and of resistor R3.

It will be within the abilities of those skilled in the art to size transistor T2 with respect to transistor T1 to obtain the above-described operation, particularly according to the values of currents I1 and I2 and to the values of resistors R1 and R2. Preferably, calling W1/L1, respectively W2/L2, the ratio of width W1, respectively W2, to the length L1, respectively L2, of transistor T1, respectively T2, ratio (W1/L1)/(W2/L2) is selected to be equal to the inverse of ratio R1/R2, that is, the ratio of the values of resistors R1 and R2. In other words, the size or dimension ratio between transistors T1 and T2 is preferably equal to the inverse of the ratio between the values of resistors R1 and R2.

Preferably, current I1 is smaller than current I2 or, in other words, the value of resistor R2 is smaller than that of resistor R1. Preferably, current I1 is negligible as compared with current I2, current I1 for example being at least ten times smaller than current I2, or even at least one hundred times smaller than current I2 or, in other words, the value of resistor R2 is negligible as compared with that of resistor R1, the value of resistor R2 being for example at least ten times smaller than the value of resistor R1, or even at least one hundred times smaller than the value of resistor R1.

Preferably, the value $I2_P$ of current I2 (during a current pulse) is in the range from 1 A to 5 A, this value for example being equal to approximately 1.5 A, or even to approximately 3 A. Preferably, the value of resistor R2 is low, for example, lower than 1 ohm, for example, equal to approximately 0.1 Ohm.

Preferably, a capacitor C is connected between the gate of transistor T1 and the terminal of resistor R1 opposite to the source of transistor T1, that is, node 105 in this example. Preferably, the value of capacitor C is greater than that of the gate capacitor of transistor T2. Such a capacitor C enables to limit or decrease the gate potential variations of transistor T1 when switch IT1 switches to the on state and the gate of transistor T2 charges.

Preferably, as shown in FIG. 2, a capacitor Cext is connected between node 105 and a node 111 set to reference potential GND. Such a capacitor Cext enables to limit or to decrease the variations of the potential of node 105, particularly when switch IT2 is off and current I2 does not flow through laser source D. Capacitor Cext is preferably external to device 100 as shown in FIG. 2, although it may also form part of device 100.

Preferably, although this is not illustrated in FIG. 2, a clamping diode is provided between node 107 and node 105, this diode having, in the example of FIG. 2, its anode connected to node 107 and its cathode connected to node 105. Such an optional clamping diode enables to prevent for the potential of node 107 to become greater than the potential of node 105 during switchings of switch IT2 to the off state.

Further, although this has not been detailed in relation with the description which has been made of the operation of device 100, a phase of starting of device 100 may be provided after its powering on, to establish the potential of node 105. Such a starting phase for example comprises leaving switches IT1 and IT2 on until the potential of node 105 has settled.

An advantage of the device 100 provided with switch IT1 is that, when switch IT1 is off between two phases of emission of a plurality of periodic laser pulses, current I1 remains regulated by transistor T1, resistor R1, and amplifier 115. Thus, when switch IT1 switches to the on state, current I2 is very rapidly regulated to the desired value.

According to another embodiment, not illustrated, the gate of transistor T2 is connected to the gate of transistor T1, switch IT1 then being omitted. In such an embodiment, current I2 flows through laser diode D when switch IT2 is on and does not flow through laser source D when switch IT2 is off. It will be within the abilities of those skilled in the art to implement this other embodiment based on the functional indications given hereinabove.

An advantage of device 100 is that it comprises no DC/DC converter and that it thus does not comprise the inductance associated with such a converter. Thus, device 100 is more compact than known devices for supplying periodic current pulses to a laser source which comprise a DC/DC converter.

Having a device 100 more compact than known devices for supplying current pulses to a laser source is particularly advantageous when device 100 is implemented by an integrated circuit. It should be noted that when device 100 is implemented by an integrated circuit, laser source D is generally external to this integrated circuit and, preferably, capacitor Cext is also external to the integrated circuit.

In the above-described device 100, to supply laser source D with periodic current pulses I2, each having value $I2_P$, current I2 is regulated to average value $\beta * I2_P$ by means of transistors T1 and T2, of resistors R1, R2, and R3, of current source 117, and of amplifier 115. To supply laser source D with periodic current pulses each having value $I2_P$, a current source, typically a current mirror, delivering a current of value $I2_P$, could have been connected in series with switch IT2, between node 101 and node 107. Node 105 would then have been coupled to node 103 by a resistive element and/or a switch. However, due to the high switching frequency of switch IT2, the value $I2_P$ of the current delivered by this current source would have been controlled less accurately than the average value $\beta * I2_P$ of the current I2 supplied by device 100. Particularly, due to the stray capacitances and/or inductances present in such a device, each current pulse supplied by such a current source would have taken time to reach value $I2_P$ and would have for example exhibited oscillations before settling at value $I2_P$.

As an example, device 100 enables to supply periodic current pulses, each having a value $I2_P$ of 3 A, at a 250-MHz frequency. When device 100 comprises switch IT1, such periodic current pulses are for example supplied during emission phases (switch IT1 on and switch IT3 off), each having a duration equal to 100 µs, two successive emission phases being for example separated from each other by a 1-ms time period when no laser pulse is emitted (switch IT1 off and switch IT3 on).

Figure 3:
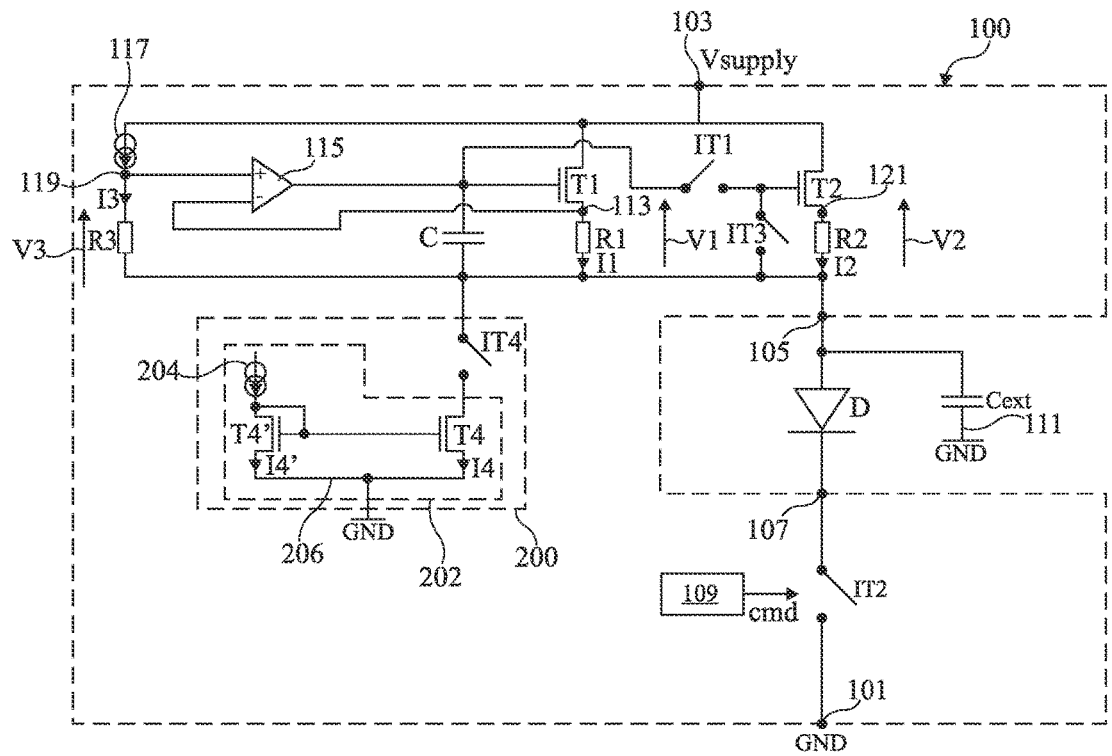
FIG. 3 shows, in the form of a circuit, an alternative embodiment of the device of FIG. 2.

FIG. 3 shows, in the form of a circuit, an alternative embodiment of the device 100 described in relation with FIG. 2. Only the differences between the device 100 described in relation with FIG. 2 and the device 100 of FIG. 3 are here highlighted.

As compared with the device 100 of FIG. 2, the device 100 of FIG. 3 further comprises an additional circuit 200, connected to node 105. Circuit 200 comprises a switch IT4 having a conduction terminal connected to node 105, and having another conduction terminal connected to a circuit 202 configured to draw a current I4 from node 105 when switch IT4 is on. In other words, circuit 200 is configured to draw current I4 from node 105 when its switch IT4 is on. Circuit 200 enables, when its switch IT4 is on, to discharge the various capacitors of device 100 when the latter is turned off. In particular, circuit 200 enables to discharge capacitor Cext. Still in other words, circuit 200 enables to draw the potential of node 105 to reference potential GND when switch IT4 is on.

According to the embodiment illustrated in FIG. 3, circuit 202 comprises a current source 204 supplying a current I4' to a first transistor T4' of a current mirror. Transistor T4' is connected between current source 204 and a node 206 at potential GND. A second transistor T4 of the current mirror is connected to switch IT4, between switch IT4 and node 206. In the example of FIG. 3, transistors T4 and T4' have an N channel. The source and the drain of transistor T4' are respectively connected to node 206 and to current source 204, the source and the drain of transistor T4 being respectively connected to node 206 and switch IT4, and the gates of transistors T4' and T4 being connected to each other and to the drain of transistor T4'.

It will be within the abilities of those skilled in the art to provide other implementations of circuit 202, and in particular of circuit 204, based on the functional indications given hereinabove. Further, all that has been discussed in relation with the device 100 of FIG. 1 applies to the device 100 of FIG. 2. For example, device 100 may comprise a charge pump or any other similar circuit for correctly powering amplifier 115.

FIG. 4 shows, in the form of a circuit, an alternative embodiment of the device 100 described in relation with FIG. 2. Only the differences between the device 100 described in relation with FIG. 2 and that of FIG. 4 are here highlighted.

As compared with the device 100 of FIG. 2, the device 100 of FIG. 4 comprises an additional circuit 300. Circuit 300 is configured to adapt power supply potential Vsupply according to a voltage between nodes 103 and 105. More particularly, circuit 300 is configured to modify potential Vsupply, preferably to decrease potential Vsupply, while ensuring that transistor T2 operates as a follower source.

An advantage of decreasing potential Vsupply is that the power consumed by device 100 decreases. Preferably, as already previously mentioned, device 100 comprises a charge pump or any other similar circuit for correctly powering amplifier 115.

Circuit 300 is more particularly configured to compare the voltage between nodes 103 and 105 with a reference voltage and, according to the difference between the two voltages, to adapt the value of potential Vsupply so that the voltage between nodes 103 and 105 is equal to the reference voltage. The reference voltage is determined by the selection of a drain-source voltage of transistor T2, that is, by the selection of a voltage drop between the conduction terminals of transistor T2, and by the value of voltage V2. More particularly, the reference voltage corresponds to the sum of the selected drain-source voltage and of voltage V2. Voltage V2 is in practice known and can be deduced from voltage V3, from the values of resistors R1 and R2, and from the sizing of transistors T1 and T2. The selected drain-source voltage is such that transistor T2 operates as a follower source.

As an example, for a current I2 having an average value of 1.5 A, a gate-source voltage of transistor T2 equal to 4.2 V, a drain-source voltage of transistor T2 equal to 0.3 V, a resistance R2 equal to 0.1 Ohm, and a potential of node 105 equal to 6.9 V (referenced to ground GND), potential Vsupply (referenced to ground GND) may be decreased to a value in the order of 7.35 V. In the case where potential Vsupply is effectively decreased to value 7.35 V, amplifier 115 is powered with a charge pump or a similar circuit to ensure that the gate-source voltage of transistor T2 is effectively equal to 4.2 V.

According to the embodiment illustrated in FIG. 4, circuit 300 comprises an error amplifier 302 configured to supply a signal err representative of the difference between the voltage between nodes 103 and 105 and the reference voltage and, more particularly, a signal err representative of the difference between a signal ref representative of the value of the reference voltage and a signal 304 representative of the current value of the voltage between nodes 103 and 105. In this example, signal 304 is supplied by an amplifier 306 connected to nodes 103 and 105. Circuit 300 further comprises a control circuit 308 configured to supply a control signal supply representative of a set point value of potential Vsupply, this set point value being determined from the signal err received by circuit 308, so that the voltage between nodes 103 and 105 is equal to the reference voltage. Although this is not shown in FIG. 3, device 100 comprises a circuit configured to modify potential Vsupply in accordance with control signal supply.

It will be within the abilities of those skilled in the art to provide other implementations of circuit 300.

Various embodiments and variants have been described. Those skilled in the art will understand that certain features of these embodiments can be combined and other variants will readily occur to those skilled in the art. In particular, the alternative embodiments described in relation with FIGS. 3 and 4 may be combined. Further, it will be within the abilities of those skilled in the art to adapt the described embodiments and variants to the case where all the N-channel transistors are replaced with P-channel transistors.

Finally, the practical implementation of the described embodiments and variations is within the abilities of those skilled in the art based on the functional indications given hereinabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device comprising:
   a first metal-oxide-semiconductor (MOS) transistor and a first resistor in series between a first node and a second node, the first resistor being connected to the second node;
   a second MOS transistor and a second resistor in series between the first node and the second node, the second resistor being connected to the second node, and a gate of the second MOS transistor being coupled to a gate of the first MOS transistor;
   an operational amplifier comprising:
      a first terminal connected to a node of connection of the first resistor to the first MOS transistor;

a second terminal; and
an output terminal coupled to the gate of the first MOS transistor;
a first circuit configured to supply a set point voltage to the second terminal of the operational amplifier; and
a first switch connected between the gate of the first MOS transistor and the gate of the second MOS transistor; and
a second switch connected between the gate of the second MOS transistor and the second node.

2. The device according to claim 1, wherein the first and second MOS transistors are each configured to operate as a follower source.

3. The device according to claim 1, further comprising a third switch connected between a third node and a fourth node, the second node being configured to be connected to a first terminal of a laser source and the third node being configured to be connected to a second terminal of the laser source.

4. The device according to claim 3, wherein the laser source is a light-emitting diode.

5. The device according to claim 4, wherein the first terminal of the laser source is an anode of the light-emitting diode and the second terminal of the laser source is a cathode of the light-emitting diode.

6. The device according to claim 3, further comprising a second circuit configured to supply a periodic control signal to the third switch connected between the third and fourth nodes.

7. The device according to claim 3, wherein the first node is configured to receive a power supply potential, and the fourth node is configured to receive a reference potential.

8. The device according to claim 7, further comprising a third circuit connected to the first and second nodes and being configured to adapt the power supply potential according to a voltage between the first and second nodes.

9. The device according to claim 1, further comprising a charge pump configured to power the operational amplifier.

10. The device according to claim 1, further comprising a fourth circuit comprising a fifth circuit and a fourth switch connected between the second node and the fifth circuit, the fifth circuit being configured to draw a current from the second node when the fourth switch of the fourth circuit is on.

11. The device according to claim 1, wherein, in response to a current flowing in the second MOS transistor, a value of the current is based on the set point voltage, a value of the first resistor, a value of the second resistor, and dimensions of the first and second MOS transistors.

12. The device according to claim 1, wherein the first circuit comprises:
a current source configured to supply a set point current, the current source being connected between the first node and the second terminal of the operational amplifier, and
a third resistor connected between the second terminal of the operational amplifier and the second node, the set point voltage being based on a value of the set point current and the third resistance.

13. The device according to claim 1, further comprising a capacitor connected between the gate of the first MOS transistor and the second node.

14. The device according to claim 1, wherein the device is an integrated circuit.

15. An electronic system comprising:
an integrated circuit, comprising:
a first metal-oxide-semiconductor (MOS) transistor and a first resistor in series between a first node and a second node, wherein the first resistor is connected to the second node;
a second MOS transistor and a second resistor in series between the first node and the second node, wherein the second resistor is connected to the second node, and a gate of the second MOS transistor is coupled to a gate of the first MOS transistor;
an operational amplifier comprising:
a first terminal connected to a node of connection of the first resistor to the first MOS transistor;
a second terminal;
an output terminal coupled to the gate of the first MOS transistor; and
a first circuit configured to supply a set point voltage to the second terminal of the operational amplifier; and
a switch connected between a third node and a fourth node;
a laser source, external to the integrated circuit, comprising:
a first terminal of the laser source connected to the second node; and
a second terminal of the laser source connected to the third node; and
a capacitor, external to the integrated circuit, connected between the gate of the first MOS transistor and the second node.

16. The electronic system according to claim 15, wherein the first and second MOS transistors are each configured to operate as a follower source.

17. The electronic system according to claim 15, wherein the laser source is a light-emitting diode, the first terminal of the laser source is an anode of the light-emitting diode, and the second terminal of the laser source is a cathode of the light-emitting diode.

18. The electronic system according to claim 15, wherein the integrated circuit further comprises a second circuit configured to supply a periodic control signal to the switch.

19. The electronic system according to claim 15, wherein the first node is configured to receive a power supply potential, and the fourth node is configured to receive a ground potential.

20. The electronic system according to claim 19, wherein the integrated circuit further comprises a third circuit connected to the first and second nodes, wherein the third circuit is configured to adapt the power supply potential according to a voltage between the first and second nodes.

21. The electronic system according to claim 19, comprising a battery configured to provide the power supply potential to the first node, and the ground potential to the fourth node.

22. A device comprising:
a first metal-oxide-semiconductor (MOS) transistor and a first resistor in series between a first node and a second node, the first resistor being connected to the second node;
a second MOS transistor and a second resistor in series between the first node and the second node, the second resistor being connected to the second node, and a gate of the second MOS transistor being coupled to a gate of the first MOS transistor;
an operational amplifier comprising:
a first terminal connected to a node of connection of the first resistor to the first MOS transistor;

a second terminal; and
an output terminal coupled to the gate of the first MOS transistor;
a first circuit configured to supply a set point voltage to the second terminal of the operational amplifier; and
a switch connected between a third node and a fourth node, the second node being configured to be connected to a first terminal of a laser source and the third node being configured to be connected to a second terminal of the laser source.

* * * * *